(12) United States Patent
Cheng et al.

(10) Patent No.: US 11,562,902 B2
(45) Date of Patent: Jan. 24, 2023

(54) HYDROGEN MANAGEMENT IN PLASMA DEPOSITED FILMS

(71) Applicant: Applied Materials, Inc., Santa Clara, CA (US)

(72) Inventors: Rui Cheng, San Jose, CA (US); Diwakar Kedlaya, San Jose, CA (US); Karthik Janakiraman, San Jose, CA (US); Gautam K. Hemani, San Jose, CA (US); Krishna Nittala, San Jose, CA (US); Alicia J. Lustgraaf, Kuna, ID (US); Zubin Huang, Santa Clara, CA (US); Brett Spaulding, Boise, ID (US); Shashank Sharma, Fremont, CA (US); Kelvin Chan, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/932,793

(22) Filed: Jul. 19, 2020

(65) Prior Publication Data

US 2022/0020583 A1    Jan. 20, 2022

(51) Int. Cl.
*H01L 21/00*    (2006.01)
*H01L 21/02*    (2006.01)
(Continued)

(52) U.S. Cl.
CPC .......... *H01L 21/0262* (2013.01); *C23C 16/24* (2013.01); *C23C 16/50* (2013.01);
(Continued)

(58) Field of Classification Search
CPC .......... H01L 27/1248; H01L 21/02502; H01L 21/02532; H01L 21/0262; H01L 21/02595; H01L 21/02488
See application file for complete search history.

(56) References Cited

U.S. PATENT DOCUMENTS

| 4,637,895 A * | 1/1987 | Ovshinsky ........ H01L 21/02579 136/258 |
| 2002/0014625 A1* | 2/2002 | Asami ............... H01L 29/66757 257/57 |

(Continued)

FOREIGN PATENT DOCUMENTS

WO    2019-195188 A1    10/2019

OTHER PUBLICATIONS

International Search Report and Written Opinion dated Nov. 2, 2021 in International Patent Application No. PCT/US2021/041369, 7 pages.

*Primary Examiner* — Brian Turner
(74) *Attorney, Agent, or Firm* — Kilpatrick Townsend & Stockton LLP

(57) ABSTRACT

Exemplary methods of semiconductor processing may include flowing a silicon-containing precursor into a processing region of a semiconductor processing chamber. A substrate may be housed within the processing region, and the substrate may be maintained at a temperature below or about 450° C. The methods may include striking a plasma of the silicon-containing precursor. The methods may include forming a layer of amorphous silicon on a semiconductor substrate. The layer of amorphous silicon may be characterized by less than or about 3% hydrogen incorporation.

17 Claims, 3 Drawing Sheets

(51) Int. Cl.
*C23C 16/24* (2006.01)
*C23C 16/56* (2006.01)
*C23C 16/50* (2006.01)

(52) U.S. Cl.
CPC .. *H01L 21/02532* (2013.01); *H01L 21/02592* (2013.01); *H01L 21/02664* (2013.01)

(56) References Cited

U.S. PATENT DOCUMENTS

| | | | |
|---|---|---|---|
| 2004/0007706 A1* | 1/2004 | Yamazaki | G02B 6/43 257/79 |
| 2005/0164424 A1* | 7/2005 | Voutsas | H01L 29/6675 438/96 |
| 2009/0154262 A1* | 6/2009 | Tokunaga | G11C 7/24 365/189.16 |
| 2011/0159673 A1 | 6/2011 | Hanawa et al. | |
| 2011/0272718 A1* | 11/2011 | Ono | H01L 27/1214 257/91 |
| 2012/0220109 A1* | 8/2012 | Komori | H01J 37/32568 118/723 E |
| 2014/0227824 A1* | 8/2014 | Chen | H01L 31/02167 438/87 |
| 2014/0335700 A1 | 11/2014 | Denifl et al. | |
| 2014/0357065 A1* | 12/2014 | Wang | C23C 16/56 438/487 |
| 2016/0284562 A1* | 9/2016 | Jeong | H01L 29/6675 |
| 2017/0221557 A1* | 8/2017 | Kim | H01L 45/08 |
| 2017/0352738 A1* | 12/2017 | Balakrishnan | H01L 21/02271 |
| 2018/0182613 A1 | 6/2018 | Blanquart et al. | |
| 2019/0096673 A1 | 3/2019 | Lee et al. | |

\* cited by examiner

HYDROGEN MANAGEMENT IN PLASMA DEPOSITED FILMS

TECHNICAL FIELD

The present technology relates to methods and systems for semiconductor processing. More specifically, the present technology relates to systems and methods for producing films with reduced hydrogen content.

BACKGROUND

Integrated circuits are made possible by processes which produce intricately patterned material layers on substrate surfaces. Producing patterned material on a substrate requires controlled methods for forming and removing material. As device sizes continue to reduce, film characteristics may lead to larger impacts on device performance. Materials used to form layers of materials may affect operational characteristics of the devices produced. As material thicknesses continue to reduce, as-deposited characteristics of the films may have a greater impact on device performance.

Thus, there is a need for improved systems and methods that can be used to produce high quality devices and structures. These and other needs are addressed by the present technology.

SUMMARY

Exemplary methods of semiconductor processing may include flowing a silicon-containing precursor into a processing region of a semiconductor processing chamber. A substrate may be housed within the processing region, and the substrate may be maintained at a temperature below or about 450° C. The methods may include striking a plasma of the silicon-containing precursor. The methods may include forming a layer of amorphous silicon on a semiconductor substrate. The layer of amorphous silicon may be characterized by less than or about 3% hydrogen incorporation.

In some embodiments, the methods may include flowing hydrogen into the processing region of the semiconductor processing chamber with the silicon-containing precursor. The hydrogen may be flowed at a flow rate of at least twice the flow rate of the silicon-containing precursor. The methods may include flowing a boron-containing precursor or a phosphorus-containing precursor into the processing region of the semiconductor processing chamber with the silicon-containing precursor. The plasma may be pulsed at a frequency of less than or about 10 kHz during the semiconductor processing method, and a duty cycle of plasma pulsing may be less than or about 50%. The methods may include performing an energy treatment on the layer of amorphous silicon. The energy treatment may further reduce the hydrogen incorporation. The energy treatment may include exposing the layer of amorphous silicon to UV, microwave, or in situ plasma. The energy treatment may be performed without breaking vacuum conditions during the semiconductor processing method.

Some embodiments of the present technology may encompass semiconductor processing methods. The methods may include flowing a silicon-containing precursor into a processing region of a semiconductor processing chamber. A substrate may be housed within the processing region, and the substrate may be maintained at a temperature below or about 450° C. The methods may include flowing a catalytic precursor into the processing region of the semiconductor processing chamber. The methods may include striking a plasma of the silicon-containing precursor and the catalytic precursor. The methods may include forming a layer of amorphous silicon on a semiconductor substrate. The layer of amorphous silicon may be characterized by less than or about 3% hydrogen incorporation.

In some embodiments, the catalytic precursor may include a boron-containing precursor, a phosphorus-containing precursor, or a silicon-and-halogen-containing precursor. The halogen may be or include fluorine, chlorine, or iodine. The plasma may be pulsed at a frequency of less than or about 10 kHz during the semiconductor processing method. A duty cycle of plasma pulsing may be less than or about 50%. The methods may include performing an energy treatment on the layer of amorphous silicon. The energy treatment may further reduce the hydrogen incorporation. The energy treatment may include exposing the layer of amorphous silicon to UV, microwave, or in situ plasma.

Some embodiments of the present technology may encompass semiconductor processing methods. The methods may include flowing a silicon-containing precursor into a processing region of a semiconductor processing chamber. A substrate may be housed within the processing region. The substrate may be maintained at a temperature below or about 450° C. The methods may include striking a plasma of the silicon-containing precursor. The methods may include forming a layer of amorphous silicon on a semiconductor substrate. The layer of amorphous silicon may be characterized by a first amount of hydrogen incorporation. The methods may include performing an energy treatment on the layer of amorphous silicon. The energy treatment may reduce an amount of hydrogen from the layer of amorphous silicon to a second amount of hydrogen incorporation less than the first amount of hydrogen incorporation.

In some embodiments, the energy treatment may include exposing the layer of amorphous silicon to UV, microwave, or in situ plasma. The second amount of hydrogen incorporation may be less than or about 2 at. %. The methods may include flowing hydrogen into the processing region of the semiconductor processing chamber with the silicon-containing precursor. The hydrogen may be flowed at a flow rate of at least twice the flow rate of the silicon-containing precursor. The plasma may be pulsed at a frequency of less than or about 10 kHz during the semiconductor processing method. A duty cycle of plasma pulsing may be less than or about 50%.

Such technology may provide numerous benefits over conventional systems and techniques. For example, embodiments of the present technology may produce films characterized by reduced hydrogen content. Additionally, the present technology may reduce hydrogen content without increasing film stress or porosity from hydrogen outgassing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
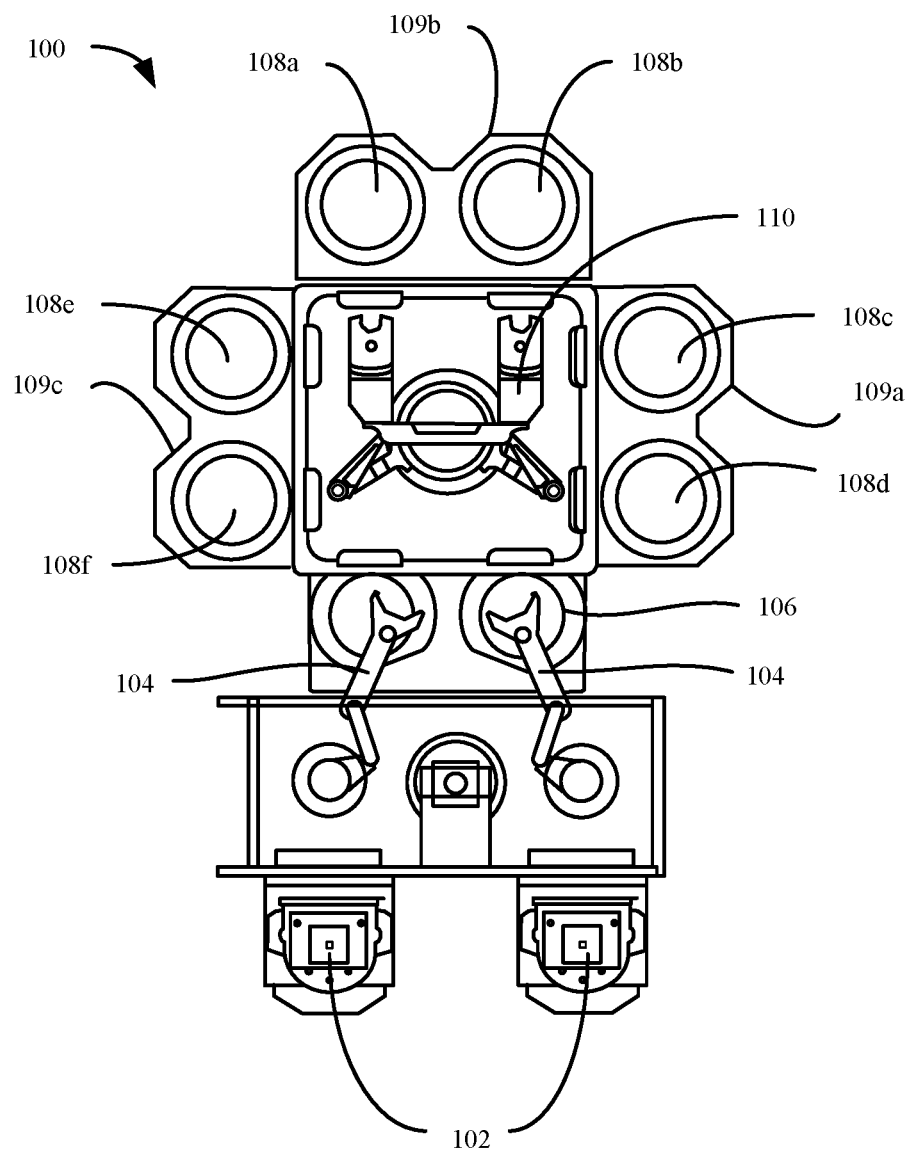
FIG. 1 shows a top view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As semiconductor device sizes continue to reduce, the constituent films included within a structure may affect device performance, as well as fabrication of other materials being included in the device. For example, processes to form silicon-containing films may use silane or other silicon-containing materials. These precursors may include hydrogen that may be incorporated within the film. Incorporating hydrogen into the film may cause additional issues during processing. For example, hydrogen incorporated in the film may be less thermally stable, and during later processing, outgassing may occur. Additionally, hydrogen may affect film stress, which may cause the film to become increasingly compressive, and which can cause film delamination as well. Finally, volumes of hydrogen within the plasma may affect the deposition process, and may cause increased grain size and crystallinity of the formed film, which may challenge deposition processes intending to form amorphous silicon films.

To reduce or compensate for hydrogen incorporation, conventional technologies may change deposition parameters, or may perform remedial actions. For example, when deposition is performed at higher temperatures, such as above or about 500° C., or above or about 600° C., hydrogen may be released during the deposition, which may improve the film quality and characteristics. Additionally, conventional technologies may perform an anneal subsequent to film deposition. The anneal process may densify the film and allow hydrogen to be removed from the structure. Although these techniques may be effective during some fabrication operations, other processes may be limited by a thermal budget.

For example, during thin-film transistor formation, or any number of other processing operations, amorphous silicon may be formed on or within a device. In some of these devices, underlying materials or structures may be incapable of withstanding temperatures associated with high-temperature deposition or anneals, and may be limited to processing temperatures that are less than or about 550° C., less than or about 500° C., less than or about 450° C., less than or about 400° C., or less. Conventional technologies may be limited to producing films having hydrogen incorporation of up to 10 at. % or more. For thin-film transistor formation, increased hydrogen incorporation may impact mobility or performance of the transistor.

The present technology overcomes these issues by performing plasma deposition processes where the as-deposited film may be characterized by a reduced hydrogen incorporation. By adjusting one or more process operations or parameters, the present technology may produce amorphous silicon films characterized by reduced hydrogen incorporation, and the films may be produced at reduced temperature. This may protect underlying structures, which may be incapable of being exposed to temperatures of conventional techniques.

Although the remaining disclosure will routinely identify specific deposition processes utilizing the disclosed technology, it will be readily understood that the systems and methods are equally applicable to other deposition and etch processes as may occur in the described chambers or any other chamber. Accordingly, the technology should not be considered to be so limited as for use with these specific deposition processes or chambers alone. The disclosure will discuss one possible system and chamber that may be used in performing methods according to some embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
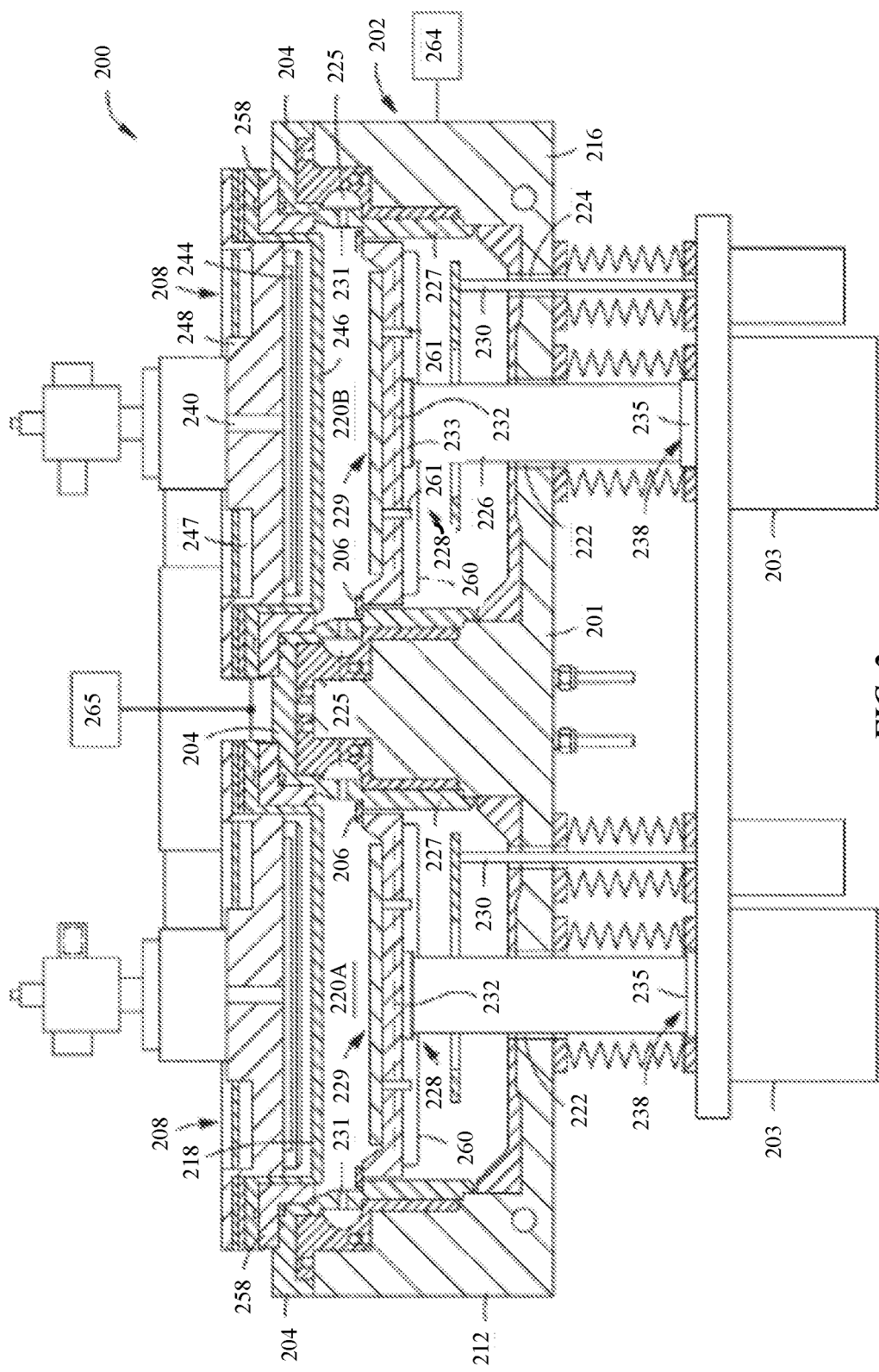
FIG. 2 shows a schematic cross-sectional view of an exemplary plasma deposition system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include components or assemblies specifically configured to perform processes according to embodiments of the present technology. The plasma system 200 generally may include a chamber body 202 having sidewalls 212, a bottom wall 216, and an interior sidewall 201 defining a pair of processing regions 220A and 220B.

Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
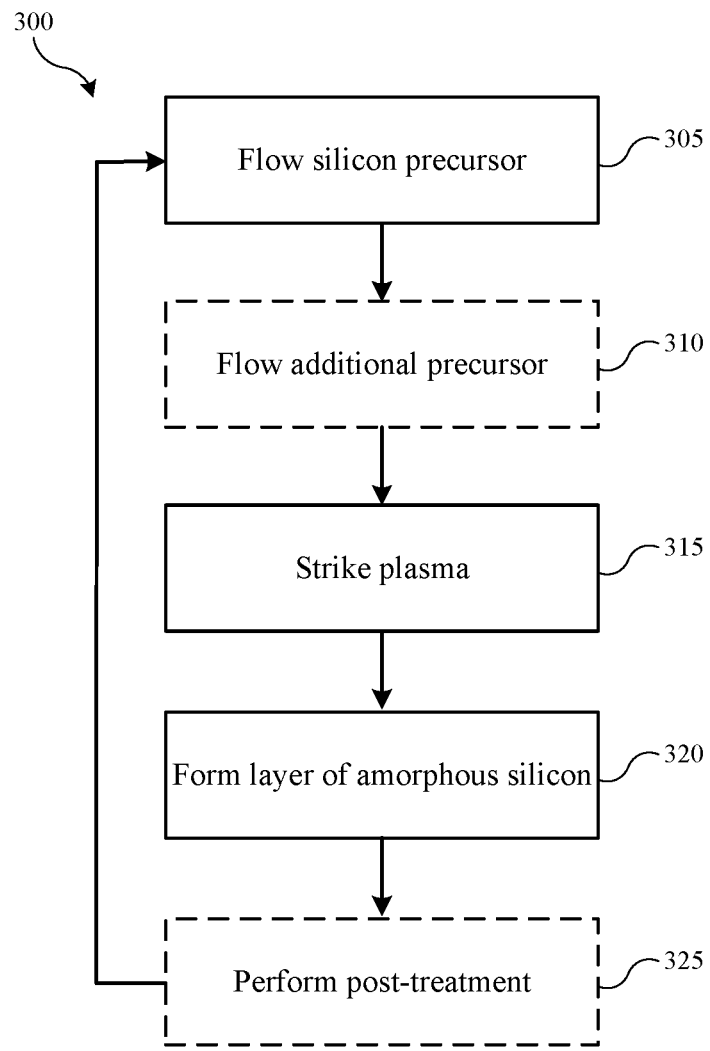
FIG. 3 shows operations in a semiconductor processing method according to some embodiments of the present technology.

FIG. 3 shows exemplary operations in a processing method 300 according to some embodiments of the present technology. The method may be performed in a variety of processing chambers, including plasma system 200 described above. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 300 may involve optional operations to develop the semiconductor structure to a particular fabrication operation. Although in some embodiments method 300 may be performed on a base structure, in some embodiments the method may be performed subsequent other material formation or removal. For example, any number of deposition, masking, or removal operations may be performed to produce any transistor, memory, or other structural aspects on a substrate. In some embodiments one or more structures formed on a substrate may be characterized by a thermal budget of less than or about 500° C., less than or about 450° C., less than or about 400° C., or less. Accordingly, method 300 and any subsequent operations may be performed at temperatures that are at or below the structural thermal budget. The substrate may be disposed on a substrate support, which may be positioned within a processing region of a semiconductor processing chamber. The operations to produce the underlying structures may be performed in the same chamber in which aspects of method 300 may be performed, and one or more operations may also be performed in one or more chambers on a similar platform as a chamber in which operations of method 300 may be performed, or on other platforms.

In some embodiments, method 300 may include forming a layer of amorphous silicon on a substrate. The methods may include flowing a silicon-containing precursor into a processing region where a substrate is housed at operation 305. The silicon-containing precursor may be delivered with a carrier gas, including an inert precursor, such as argon or helium, for example. As will be explained in further detail below, in some embodiments an additional precursor may be flowed into the processing region with the silicon-containing precursor at optional operation 310. At operation 315 a plasma may be struck of the precursors flowed into the processing region, and a layer of amorphous silicon may be deposited on the substrate at operation 320. The formation or deposition may be performed using any number of precursors, such as silane or other silicon-containing materials, and in some embodiments a silicon-containing precursor delivered may also include hydrogen. Consequently, the deposited or formed layer of amorphous silicon may be characterized by a first amount of hydrogen incorporation. Although the remaining disclosure will discuss amorphous silicon films, it is to be understood that the silicon films may include additional materials, which may produce doped amorphous silicon. For example, embodiments of the present technology may encompass silicon films which may be formed with a dopant, such as phosphorous, boron, sulfur, arsenic, or other materials.

As noted previously, some embodiments of the present technology may encompass films formed over materials or structures characterized by a thermal budget less than or about 550° C., less than or about 500° C., less than or about 450° C., less than or about 400° C., less than or about 350° C., less than or about 300° C., or less. Accordingly, the layer of amorphous silicon may be formed at or below any of these temperatures in some embodiments to accommodate the underlying materials, and in some embodiments one or more operations, including all operations of method 300, may be performed at or below any of these temperatures, and a substrate being processed may be maintained below or about any of these temperatures throughout processing. Processing pressures during formation may be greater than or about 1 Torr in some embodiments, and may be between about 2 Torr and about 20 Torr. The film may also be formed with any silicon-containing material, such as silane or other binary silicon-hydrogen compounds, as well as any silicon-and-hydrogen-containing precursor. Consequently, the formed layer may be characterized by a first amount of hydrogen incorporation. Because higher temperature deposition and anneals may not be feasible for some structures, without any other interactions as will be described below, the hydrogen incorporation may be greater than or about 3 at. %, greater than or about 5 at. %, greater than or about 7 at. %, greater than or about 10 at. %, or more. This may cause any of the challenges described previously, including stress effects and subsequent outgassing. Accordingly, in some embodiments of the present technology, one or more modifications may be made to produce a film where the as-deposited film may be characterized by a hydrogen incorporation of less than or about 3 at. % or less.

As noted at optional operation 310, in some embodiments one or more additional precursors may be delivered with the silicon-containing precursors. For example, in some embodiments the methods may further include flowing hydrogen into the processing region of the semiconductor processing chamber with the silicon-containing precursor. Although counterintuitive for a process intended to reduce hydrogen incorporation in a produced silicon film, the present technology surprisingly may produce such results with the addition of hydrogen in the processing gases.

When precursors are dissociated in a plasma, many of the silicon-hydrogen bonds may be broken, although an amount of silicon and hydrogen bonding may still occur within the formed film, accounting for the hydrogen incorporation of the final film. However, when an additional amount of hydrogen is incorporated, the plasma will additionally dissociate the hydrogen, such as from hydrogen gas, which may produce a number of hydrogen radicals and ions. Because these particles are small, they may easily penetrate the film being deposited. Additionally, these particles may be characterized by relatively high energy, which may then be transferred into the film to break additional silicon and hydrogen bonds. The energy may also be sufficient to form hydrogen bonds with the hydrogen removed from silicon-hydrogen bonds, which may produce hydrogen gas. This newly formed hydrogen gas may flow from the film during the formation process itself, which may limit porosity or film degradation.

To produce the effect of reducing hydrogen within the film by adding hydrogen in the plasma precursors, the flow of hydrogen may be greater than the flow of the silicon-containing material. For example, in some embodiments the flow rate of the hydrogen compared to the flow rate of the silicon-containing precursor may be greater than or about 2:1, and may be greater than or about 5:1, greater than or about 10:1, greater than or about 20:1, greater than or about 50:1, greater than or about 75:1, greater than or about 100:1, or more. This may provide sufficient hydrogen radicals to permeate the film being deposited, break additional silicon-hydrogen bonds, and form hydrogen bonds which may remove the hydrogen from the film.

In some embodiments the additional precursor being delivered may be a precursor configured to produce a catalytic reaction with the silicon-containing precursor. Boron-containing precursors, phosphorous containing precursors, and some silicon-containing precursors may provide this catalytic effect. For example, borane, which may include diborane, phosphine, and silicon halides may interact with silane or higher-order silanes to reduce the decomposition temperature of the silanes, which may lower the energy barrier to break silicon-hydrogen bonds. This may further limit hydrogen incorporation in the film being produced. The silicon halides may include any number of halogen species including fluorine, chlorine, bromine, and iodine.

Adjusting the plasma formation process may also facilitate removal of hydrogen from films being produced in some embodiments. For example, some embodiments of the present technology may include pulsing the plasma power during plasma generation. The plasma may be generated at a plasma-generation frequency, such as 13.56 MHz in one non-limiting example. The plasma power may also be pulsed at a pulsing frequency that may be less than or about 10 kHz, and may be less than or about 9 kHz, less than or about 8 kHz, less than or about 7 kHz, less than or about 6 kHz, less than or about 5 kHz, less than or about 4 kHz, less than or about 3 kHz, less than or about 2 kHz, less than or about 1 kHz, or less. The duty cycle of the pulsing frequency may provide an amount of "off" time for the plasma generation.

During plasma "off" periods, deposition may not be occurring. While previously formed ions may quickly extinguish, radical species may still contact the heated substrate and transfer energy into the amorphous lattice being produced. This may continue to activate and break additional silicon-hydrogen bonds within the film, which may then be removed from the film. At high duty cycle, insufficient time may be afforded for this effect before deposition resumes. Accordingly, in some embodiments, the duty cycle may be maintained at less than or about 50%, and may be maintained at less than or about 45%, less than or about 40%, less than or about 35%, less than or about 30%, less than or about 25%, less than or about 20%, less than or about 15%, less than or about 10%, less than or about 5%, or less. Any of these techniques, alone or in combination, may reduce hydrogen incorporation in the as-deposited film to produce amorphous silicon films characterized by a hydrogen incorporation of less than or about 3 at. %, and may reduce hydrogen incorporation to less than or about 2.5 at. %, less than or about 2.4 at. %, less than or about 2.3 at. %, less than or about 2.2 at. %, less than or about 2.1 at. %, less than or about 2.0 at. %, less than or about 1.9 at. %, less than or about 1.8 at. %, less than or about 1.7 at. %, less than or about 1.6 at. %, less than or about 1.5 at. %, less than or about 1.4 at. %, less than or about 1.3 at. %, less than or about 1.2 at. %, less than or about 1.1 at. %, less than or about 1.0 at. %, or less.

Subsequent film formation, in some embodiments the substrate on which the layer of amorphous silicon was formed may be further treated in a post-treatment process at optional operation 325, which may be an additional energy treatment. The post treatment may be performed in the same chamber as the deposition, or the substrate may be transferred from a first processing chamber to a second processing chamber. In some embodiments, the second chamber may be on the same tool, such as previously described, and the transfer may be performed while maintaining vacuum conditions for the substrate. The post-treatment process may be configured to further reduce hydrogen incorporation in the film produced by transferring additional energy into the deposited film, and break additional silicon-hydrogen bonds. This may further reduce an amount of hydrogen incorporation within the layer from a first amount during deposition to a second amount of hydrogen incorporation, which may be less than the first amount of hydrogen incorporation. The second amount of hydrogen incorporation may less than or about 2 at. %, and may be less than or about 1.5 at. %, less than or about 1.0 at. %, less than or about 0.5 at. % or less.

The post treatment may include any number of processes configured to provide additional energy transfer, while maintaining the thermal budget. Accordingly, a thermal anneal may not be performed in some embodiments, and post-treatment processes may be performed at any of the temperatures as previously stated. Post-treatment processes may include UV exposure, microwave exposure, or in situ plasma exposure. For example, UV exposure may be performed while maintaining the temperature below or about 450° C., or less, and the exposure may be performed for greater than or about 5 minutes, greater than or about 10 minutes, greater than or about 15 minutes, greater than or about 20 minutes, greater than or about 25 minutes, greater than or about 30 minutes, or more. Similarly a microwave anneal may be performed at similar temperatures for greater than or about 1 minute, greater than or about 2 minutes, greater than or about 5 minutes, greater than or about 10 minutes, or more.

Subsequent formation, flow of the silicon-containing precursor may be halted, and a post-treatment plasma exposure may be performed with hydrogen or an inert gas, such as helium or argon. The plasma may be formed at low power to limit sputtering of the film produced, and in some embodiments the post-treatment plasma may be formed at less than or about 2,500 W, and may be formed at less than or about 2,000 W, less than or about 1,500 W, less than or about 1,000 W, less than or about 500 W, or less. To limit formation of pores within the film during the treatment, method 300 may be cycled to incorporate the treatment at intermediate periods during the film formation. For example, in some embodiments the film may be formed in at least two operations, where each operation may form less than or about 50% of a total thickness of the film, and may form less than or about 30%, less than or about 25%, less than or about 20%, or less. In between formation cycles, a post treatment may be performed to remove additional hydrogen from the portion of the film formed. To limit reductions in queue time, plasma treatments may be performed within the deposition chamber, and other energy treatments may be performed in a chamber on the same tool as the deposition chamber. By utilizing one or more aspects of the present technology, hydrogen incorporation within a film may be reduced compared to conventional technologies. Additionally, the processes described may be performed at lower temperatures than many conventional techniques, which may accommodate structures that may be constrained by a thermal budget.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
flowing a silicon-containing precursor into a processing region of a semiconductor processing chamber, wherein a substrate is housed within the processing region, and wherein the substrate is maintained at a temperature below or about 450° C.;
flowing hydrogen into the processing region of the semiconductor processing chamber with the silicon-containing precursor, wherein a flow rate of the hydrogen compared to a flow rate of the silicon-containing precursor is greater than or about 20:1;
striking a plasma of the silicon-containing precursor; and
forming a layer of amorphous silicon on a semiconductor substrate, wherein the as-deposited layer of amorphous silicon is characterized by less than or about 3 at. % hydrogen incorporation.

2. The semiconductor processing method of claim 1, wherein the flow rate of the hydrogen compared to the flow rate of the silicon-containing precursor is greater than or about 50:1.

3. The semiconductor processing method of claim 1, further comprising:
flowing a boron-containing precursor or a phosphorus-containing precursor into the processing region of the semiconductor processing chamber with the silicon-containing precursor.

4. The semiconductor processing method of claim 1, wherein the plasma is pulsed at a frequency of less than or about 10 kHz during the semiconductor processing method, and wherein a duty cycle of plasma pulsing is less than or about 50%.

5. The semiconductor processing method of claim 1, further comprising:
performing an energy treatment on the layer of amorphous silicon, wherein the energy treatment further reduces the hydrogen incorporation.

6. The semiconductor processing method of claim 5, wherein the energy treatment comprises exposing the layer of amorphous silicon to UV, microwave, or in situ plasma.

7. The semiconductor processing method of claim 5, wherein the energy treatment is performed without breaking vacuum conditions during the semiconductor processing method.

8. A semiconductor processing method comprising:
flowing a silicon-containing precursor into a processing region of a semiconductor processing chamber, wherein a substrate is housed within the processing region, and wherein the substrate is maintained at a temperature below or about 450° C.;
flowing a catalytic precursor into the processing region of the semiconductor processing chamber, wherein the catalytic precursor comprises a silicon-and-halogen-containing precursor, and wherein the halogen comprises fluorine, chlorine, or iodine;
striking a plasma of the silicon-containing precursor and the catalytic precursor; and
forming a layer of amorphous silicon on a semiconductor substrate, wherein the as-deposited layer of amorphous silicon is characterized by less than or about 3 at. % hydrogen incorporation.

9. The semiconductor processing method of claim 8, wherein the catalytic precursor comprises a boron-containing precursor, a phosphorus-containing precursor, or a silicon-and-halogen-containing precursor.

10. The semiconductor processing method of claim 8, wherein the plasma is pulsed at a frequency of less than or about 10 kHz during the semiconductor processing method, and wherein a duty cycle of plasma pulsing is less than or about 50%.

11. The semiconductor processing method of claim 8, further comprising:
performing an energy treatment on the layer of amorphous silicon, wherein the energy treatment further reduces the hydrogen incorporation.

12. The semiconductor processing method of claim 11, wherein the energy treatment comprises exposing the layer of amorphous silicon to UV, microwave, or in situ plasma.

13. A semiconductor processing method comprising:
flowing a silicon-containing precursor into a processing region of a semiconductor processing chamber, wherein a substrate is housed within the processing region, and wherein the substrate is maintained at a temperature below or about 450° C.;
flowing hydrogen into the processing region of the semiconductor processing chamber with the silicon-containing precursor, wherein a flow rate of the hydrogen compared to a flow rate of the silicon-containing precursor is greater than or about 20:1;
striking a plasma of the silicon-containing precursor;
forming a layer of amorphous silicon on a semiconductor substrate, wherein the layer of amorphous silicon as-deposited is characterized by a first amount of hydrogen incorporation of less than or about 3 at. %; and
performing an energy treatment on the layer of amorphous silicon, wherein the energy treatment reduces an amount of hydrogen from the layer of amorphous silicon to a second amount of hydrogen incorporation less than the first amount of hydrogen incorporation.

14. The semiconductor processing method of claim 13, wherein the energy treatment comprises exposing the layer of amorphous silicon to UV, microwave, or in situ plasma.

15. The semiconductor processing method of claim 13, wherein the second amount of hydrogen incorporation is less than or about 2 at. %.

16. The semiconductor processing method of claim 13, wherein the hydrogen is flowed at a flow rate of at least twice the flow rate of the silicon-containing precursor.

17. The semiconductor processing method of claim 13, wherein the plasma is pulsed at a frequency of less than or about 10 kHz during the semiconductor processing method, and wherein a duty cycle of plasma pulsing is less than or about 50%.

* * * * *